(12) United States Patent
You et al.

(10) Patent No.: US 9,941,341 B2
(45) Date of Patent: Apr. 10, 2018

(54) TRANSPARENT DISPLAY APPARATUS

(71) Applicant: SAMSUNG DISPLAY CO., LTD., Yongin-si, Gyeonggi-Do (KR)

(72) Inventors: Chungi You, Yongin-si (KR); Gwanggeun Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/040,003

(22) Filed: Feb. 10, 2016

(65) Prior Publication Data
US 2017/0005154 A1 Jan. 5, 2017

(30) Foreign Application Priority Data

Jul. 3, 2015 (KR) .................. 10-2015-0095197

(51) Int. Cl.
*H01L 27/32* (2006.01)
*H01L 29/45* (2006.01)

(52) U.S. Cl.
CPC ........ *H01L 27/3262* (2013.01); *H01L 27/326* (2013.01); *H01L 27/3211* (2013.01); *H01L 27/3258* (2013.01); *H01L 27/3265* (2013.01); *H01L 29/45* (2013.01); *H01L 2227/323* (2013.01)

(58) Field of Classification Search
None
See application file for complete search history.

(56) References Cited

U.S. PATENT DOCUMENTS

| | | | | |
|---|---|---|---|---|
| 8,106,402 B2* | 1/2012 | Yeo | ............... | H01L 27/3248 257/59 |
| 8,614,699 B2* | 12/2013 | Miyake | ............... | G09G 3/3233 315/169.3 |
| 8,659,218 B2* | 2/2014 | Hwang | ............... | H01L 27/3258 313/504 |
| 9,117,779 B2* | 8/2015 | Ha | ............... | H01L 27/322 |
| 2011/0169720 A1 | 7/2011 | Hwang et al. | | |
| 2012/0049215 A1 | 3/2012 | Yoon et al. | | |

(Continued)

FOREIGN PATENT DOCUMENTS

| | | |
|---|---|---|
| KR | 1020120019026 | 3/2012 |
| KR | 1020120076129 | 7/2012 |
| KR | 1020130138883 | 12/2013 |

*Primary Examiner* — Ali Naraghi
(74) *Attorney, Agent, or Firm* — F. Chau & Associates, LLC

(57) ABSTRACT

A display apparatus includes a pixel including a first area and a second area. Light is emitted from the first area and ambient light is transmitted through the second area. A pixel circuit unit is disposed in the first area, the pixel circuit unit including at least one thin-film transistor (TFT). A first insulating layer covers the pixel circuit unit. A first electrode is disposed on the first insulating layer, and is electrically connected to the pixel circuit unit. A second insulating layer covers an edge of the first electrode. A second electrode is aligned with the first electrode and is disposed in at least the first area. An intermediate layer is disposed between the first and second electrodes and includes an emission layer. An inorganic insulating film is disposed in the second area of the pixel. An organic insulating film covers the inorganic insulating film in the second area.

18 Claims, 17 Drawing Sheets

(56) References Cited

U.S. PATENT DOCUMENTS

| | | | | |
|---|---|---|---|---|
| 2012/0326150 A1* | 12/2012 | Kim | .................... | H01L 51/5275 257/59 |
| 2013/0328022 A1* | 12/2013 | Choi | ................... | H01L 51/5008 257/40 |
| 2016/0111487 A1* | 4/2016 | Jeong | ................. | H01L 27/3279 257/40 |
| 2016/0149155 A1* | 5/2016 | Kim | .................... | H01L 51/5228 257/40 |
| 2016/0300902 A1* | 10/2016 | You | .................... | H01L 27/3276 |

* cited by examiner

TRANSPARENT DISPLAY APPARATUS

CROSS-REFERENCE TO RELATED APPLICATION(S)

This application claims priority under 35 U.S.C. § 119 to Korean Patent Application No. 10-2015-0095197, filed on Jul. 3, 2015, in the Korean Intellectual Property Office, the disclosure of which is incorporated by reference herein in its entirety.

TECHNICAL FIELD

Exemplary embodiments of the present invention relate to a display apparatus, and more particularly, to a transparent display apparatus.

DISCUSSION OF THE RELATED ART

A display apparatus may be formed to be a transparent display apparatus by making a transparent thin-film transistor that is disposed in the display apparatus.

Since an organic light-emitting display apparatus is a self-emissive display apparatus that does not need a separate light source, the organic light-emitting display apparatus may operate at a low voltage, may be configured to have a light-weight and thin design, and may have wide viewing angles, a high contrast ratio, and fast response rates.

SUMMARY

In an exemplary embodiment of the present invention, a display apparatus includes a pixel including a first area and a second area, wherein light is emitted from the first area and ambient light is transmitted through the second area. A pixel circuit unit is disposed in the first area of the pixel, the pixel circuit unit including at least one thin-film transistor (TFT). A first insulating layer covers the pixel circuit unit in the first area. A first electrode is disposed on the first insulating layer in the first area, the first electrode being electrically connected to the pixel circuit unit. A second insulating layer covers an edge of the first electrode in the first area. A second electrode is aligned with the first electrode and is disposed in at least the first area. An intermediate layer is disposed between the first electrode and the second electrode, the intermediate layer including an emission layer. An inorganic insulating film is disposed in the second area of the pixel. An organic insulating film covers the inorganic insulating film in the second area.

According to an exemplary embodiment of the present invention, the organic insulating film is a part of the first insulating layer that is disposed in the second area.

According to an exemplary embodiment of the present invention, a first distance between a substrate and a top surface of the organic insulating film covering the inorganic insulating film in the second area is smaller than a second distance between the substrate and a top surface of the first insulating layer that is disposed in the first area.

According to an exemplary embodiment of the present invention, the second insulating layer covers all edges of the first electrode in the first area, and wherein the second insulating layer has a closed-loop shape.

According to an exemplary embodiment of the present invention, the organic insulating film covering the inorganic insulating film in the second area is a part of the second insulating layer that is disposed in the second area.

According to an exemplary embodiment of the present invention, a third distance between a substrate and a top surface of the organic insulating film covering the inorganic insulating film in the second area is smaller than a fourth distance between the substrate and a top surface of the second insulating layer that is disposed in the first area.

According to an exemplary embodiment of the present invention, at least a part of the pixel circuit unit overlaps the first electrode.

According to an exemplary embodiment of the present invention, the inorganic insulating film includes a single film or a double-layered film including $SiO_2$ or $SiN_x$.

According to an exemplary embodiment of the present invention, the TFT includes an active layer. A gate electrode is disposed on the active layer, the gate electrode being insulated from the active layer. A third insulating layer is disposed between the active layer and the gate electrode. A plurality of fourth insulating layers are disposed on the gate electrode. A source electrode and a drain electrode are disposed on the plurality of fourth insulating layers, the source electrode and the drain electrode being electrically connected to the active layer.

According to an exemplary embodiment of the present invention, the source electrode includes a lower electrode and an upper electrode, wherein the upper electrode of the source electrode includes a first conductive material and the lower electrode of the source electrode includes a conductive material that is different from the first conductive material. The drain electrode includes a lower electrode and an upper electrode, wherein the upper electrode of the drain electrode includes a second conductive material and the lower electrode of the drain electrode includes a conductive material that is different from the second conductive material.

According to an exemplary embodiment of the present invention, each of the first and second conductive materials includes a transparent conductive material.

According to an exemplary embodiment of the present invention, the third insulating layer includes a same material as a material included in the inorganic insulating film.

According to an exemplary embodiment of the present invention, the plurality of fourth insulating layers include single films or double-layered films including $SiO_2$ or $SiN_x$.

According to an exemplary embodiment of the present invention, the display apparatus further includes a capacitor including a first capacitor electrode that is disposed on a same layer as the gate electrode, a second capacitor electrode that is disposed between the plurality of fourth insulating layers, and a third capacitor electrode that is disposed on a same layer as the source and drain electrodes.

According to an exemplary embodiment of the present invention, the second area is formed beside the first area.

BRIEF DESCRIPTION OF THE DRAWINGS

The above and other features and aspects of the present invention will become more apparent and more readily appreciated from the following description of the exemplary embodiments thereof, taken in conjunction with the accompanying drawings, in which.

DETAILED DESCRIPTION OF THE EMBODIMENTS

Figure 1:
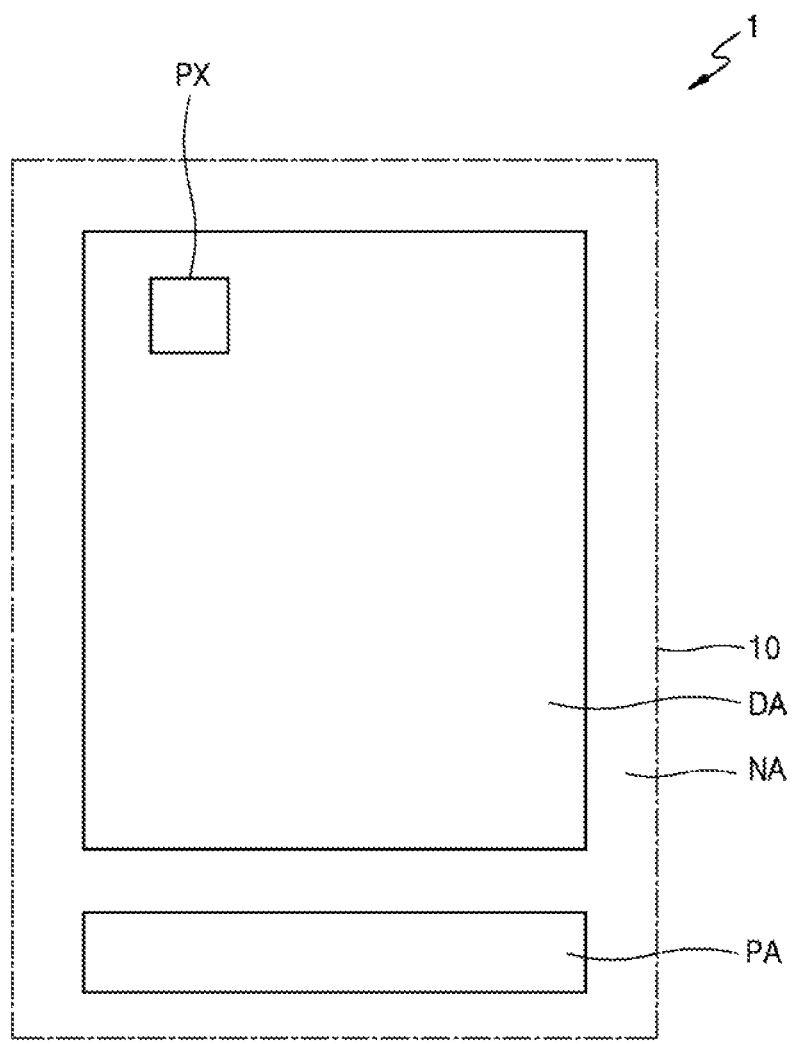
FIG. 1 is a plan view of a display apparatus according to an exemplary embodiment of the present invention.

The present invention may include various exemplary embodiments thereof and modifications thereto. Exemplary embodiments of the present invention will be illustrated in detail with reference to the drawings. Aspects and features of the present invention and methods of achieving them will be described more fully hereinafter with reference to the accompanying drawings. In the drawings, exemplary embodiments of the present invention are shown. The present invention may, however, be embodied in many different forms and should not be construed as being limited to the exemplary embodiments thereof set forth herein; rather these exemplary embodiments are provided so that this disclosure may be thorough, and may fully convey the inventive concept to one of ordinary skill in the art.

Exemplary embodiments of the present invention will now be described with reference to the accompanying drawings. In the drawings, the same elements may be denoted by the same reference numerals throughout the specification, and a repeated explanation thereof might not be given.

As used herein, the singular forms "a", "an" and "the" are intended to include the plural forms as well, unless the context clearly indicates otherwise.

It will be understood that when a layer, region, or element is referred to as being "formed on", another layer, region, or element, it may be directly formed on the other layer, region, or element, or intervening layers, regions or elements may be disposed therebetween.

Sizes of elements may be exaggerated for convenience of explanation. Since sizes and thicknesses of elements in the drawings may be arbitrarily illustrated for convenience of explanation, the present invention is not limited thereto.

Figure 2:
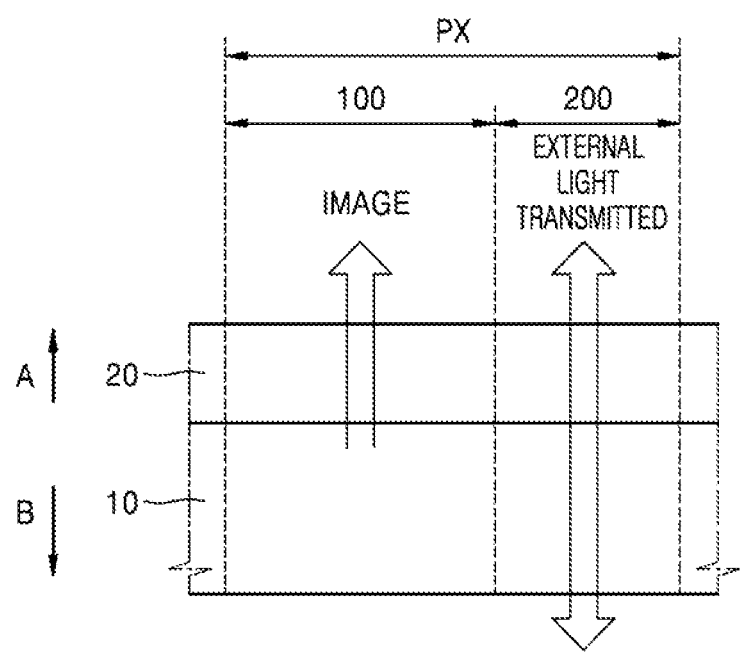
FIG. 2 is a cross-sectional view illustrating a part of the display apparatus of FIG. 1, according to an exemplary embodiment of the present invention.

As used herein, the term "and/or" may include any and all combinations of one or more of the associated listed items. FIG. 1 is a plan view of a display apparatus 1 according to an exemplary embodiment of the present invention. FIG. 2 is a cross-sectional view illustrating a part of the display apparatus 1 of FIG. 1, according to an exemplary embodiment of the present invention.

Referring to FIGS. 1 and 2, the display apparatus 1, according to an exemplary embodiment of the present invention, includes a substrate 10 and a display unit 20 that is formed at a display area DA of the substrate 10. A pad unit PA is formed at a non-display area NA that is disposed around the display area DA. The display apparatus 1 may be an organic light-emitting display apparatus.

The display unit 20 includes a plurality of pixels PX. Each of the pixels PX includes a first area 100 and a second area 200. An image is formed in the first area 100, through which light is emitted. External light is transmitted through the second area 200. For example, the external light passes through the second area 200. The external light is transmitted through the substrate 10 and the display unit 20.

The plurality of pixels PX are arranged in a matrix of rows and columns. In this case, the pixels PX are arranged so that the first areas 100 and the second areas 200 are alternately and repeatedly disposed in a first direction. Accordingly, the first areas 100 and the second areas 200 of the display unit 20 are regularly formed at predetermined intervals in the first direction.

The display unit 20 may be configured to transmit external light therethrough, and a user who is located at a side where an image is displayed may also observe an image outside the substrate 10. For example, according to an exemplary embodiment of the present invention, light (e.g., external light not generated by the display unit 20) may pass through the substrate 10 and the display unit 20. Accordingly, a user may see an image generated by the display unit 20, and the user may simultaneously see what is disposed behind the display unit 20 by light passing through the display unit 20. Although the display apparatus 1 is a top-emission type display apparatus in which an image is displayed at an "A" direction of the substrate 10 in FIG. 2, the present invention is not limited thereto. For example, the display apparatus 1 may be a bottom-emission type display apparatus in which an image generated by the display unit 20 is displayed on a "B" direction of the substrate 10, or top and bottom-emission type display apparatus in which an image generated by the display unit 20 is displayed at both "A" and "B" directions of the substrate 10.

Since each of the pixels PX includes the first area 100, in which an image is displayed, and the second area 200, through which external light is transmitted, in an exemplary embodiment of the present invention, the user may observe an image that is displayed on the display unit 20 and/or an external image through the display apparatus 1.

Since a thin-film transistor (TFT), a capacitor, and a light-emitting device are not disposed in the second area 200 of each pixel PX of the display apparatus 1, according to an exemplary embodiment of the present invention, an external light transmittance through the second area 200 may be increased. Accordingly, an external light transmittance of the display apparatus 1 may increase. In addition, image distortion, which occurs due to interference with the TFT, the capacitor, and/or the light-emitting device, may be avoided.

The substrate 10 may be sealed by a sealing member. The sealing member may be a sealing substrate that is coupled with the substrate 10 by using a sealing material. The sealing member may be an encapsulation thin film having a structure in which an inorganic material and an organic material are alternately stacked on the substrate 10. A moisture absorbent or a filler may be provided between the substrate 10 and the sealing member. The filler may include silicon.

Figure 3:
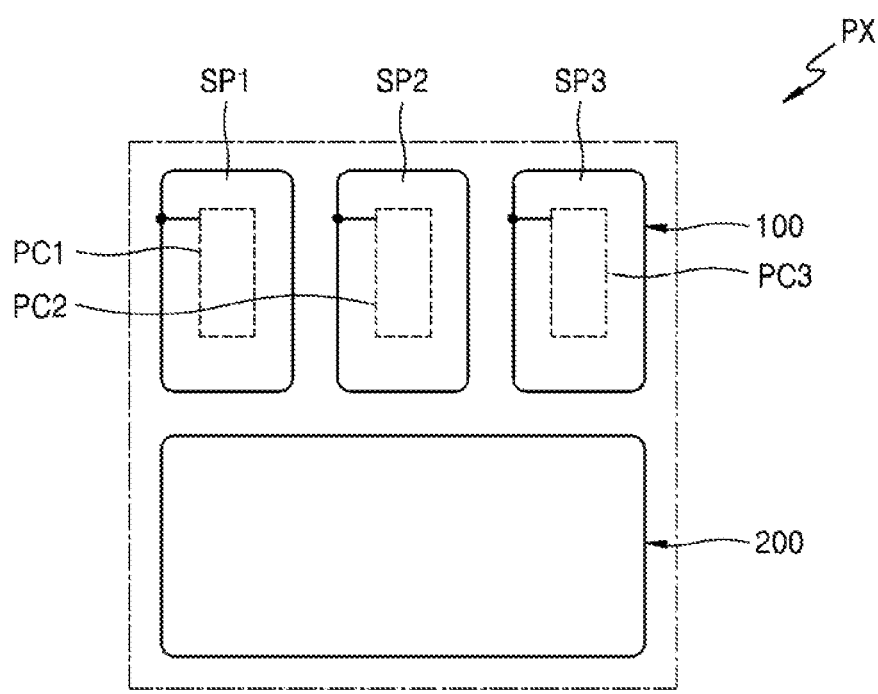
FIG. 3 is a plan view illustrating pixels that are included in the display apparatus of FIG. 2, according to an exemplary embodiment of the present invention.

FIG. 3 is a plan view illustrating the pixels PX that are included in the display apparatus 1 of FIG. 2, according to an exemplary embodiment of the present invention.

Referring to FIG. 3, each of the pixels PX may include the first area 100, through which light is emitted, and the second area 200 that is disposed adjacent to the first area 100 and is formed at a side of the first area 100. External light is transmitted through (e.g., passes through) the second area 200. The user may observe an external image through the second area 200. For example, the user may observe what is disposed behind the display apparatus 1 through light that passes through a plurality of second areas 200 of the display apparatus 1. Accordingly, the display apparatus 1 may be a transparent display apparatus.

A first sub-pixel SP1, a second sub-pixel SP2, and a third sub-pixel SP3 that emit light of different colors may be disposed in corresponding first areas 100, as shown in FIG. 3. For example, the pixel PX may include three first areas 100 and each of the first, second, and third sub-pixels SP1, SP2, and SP3 may be disposed in a corresponding first area 100, from among the three first areas 100. The first sub-pixel SP1, the second sub-pixel SP2, and the third sub-pixel SP3 may respectively emit red light, green light, and blue light. However, the present invention is not limited thereto. For example, any other combinations than the combination of red, green, and blue light may be made as long as white light may be formed through the combination. Also, three or more sub-pixels or two or less sub-pixels may be disposed in the first area 100. Sizes of the sub-pixels may be the same or different from one another.

The first sub-pixel SP1, the second sub-pixel SP2, and the third sub-pixel SP3 may be respectively driven by a first pixel circuit unit PC1, a second pixel circuit unit PC2, and a third pixel circuit unit PC3.

The first pixel circuit unit PC1, the second pixel circuit unit PC2, and the third pixel circuit unit PC3 may be disposed on the substrate 10 so that at least a part of each of the first pixel circuit unit PC1, the second pixel circuit unit PC2, and the third pixel circuit unit PC3 overlaps a first electrode 121 (see FIG. 4) included in each of the first sub-pixel SP1, the second sub-pixel SP2, and the third sub-pixel SP3.

Since the first electrode 121 (see FIG. 4) is a reflective electrode, a second electrode 125 (see FIG. 4) is a transparent or a semi-transparent electrode that is suitable for a top-emission type display apparatus, and the first, second, and third pixel circuit units PC1, PC2, and PC3 are disposed between the substrate 10 and the first electrodes 121 corresponding to each of the first, second, and third sub-pixel SP1, SP2, and SP3, a separate space in which the first, second, and third pixel circuit units PC1, PC2, and PC3 are disposed does not need to be secured. Accordingly, an aperture ratio is increased.

However, the present invention is not limited thereto. A display apparatus, according to an exemplary embodiment of the present invention, may be a bottom-emission type display apparatus in which a first electrode is a transparent or semi-transparent electrode and a second electrode is a reflective electrode. In this case, a pixel circuit unit may not overlap the first electrode to not interfere with a path of emitted light.

A device including an opaque material such as a reflective electrode or a wiring might not be disposed in the second area 200. For example, according to an exemplary embodiment of the present invention, opaque materials are not disposed in the second area 200. A transparent insulating film may be disposed in the second area 200. The second area 200 may be divided by an opaque wiring that passes through an edge portion of each pixel PX.

The second area 200 may be one undivided area as shown in FIG. 3, according to an exemplary embodiment of the present invention. However, the present invention is not limited thereto. For example, the second area 200 may be divided into second areas 200, each of which corresponding to one of the first sub-pixel SP1, the second sub-pixel SP2, and the third sub-pixel SP3. In addition, the second areas 200 corresponding to the first to third sub-pixels SP1 to SP3 need not be connected to each other. For example, only the second areas 200 of two adjacent sub-pixels, among the first sub-pixel SP1, the second sub-pixel SP2, and the third sub-pixel SP3, may be connected to each other.

Figure 4:
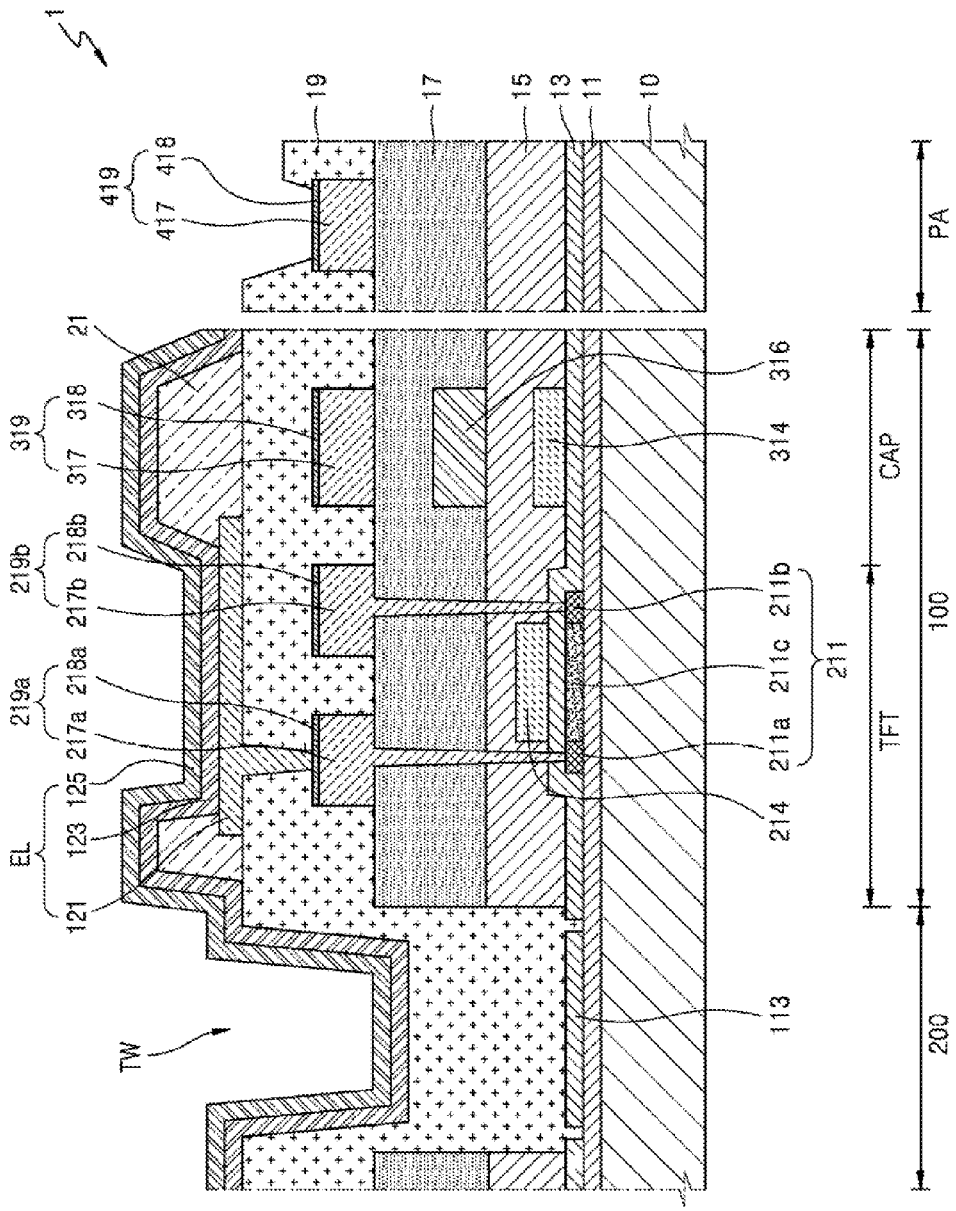
FIG. 4 is a cross-sectional view illustrating a part of one pixel and a part of a pad unit of the display apparatus of FIG. 1, according to an exemplary embodiment of the present invention.

FIG. 4 is a cross-sectional view illustrating a part of one pixel PX and a part of the pad unit PA of the display apparatus 1 of FIG. 1, according to an exemplary embodiment of the present invention.

Referring to FIG. 4, the pixel PX of the display apparatus 1, according to an exemplary embodiment of the present invention, is disposed on the substrate 10. The pixel PX includes the first area 100, through which light is emitted, and the second area 200, through which external light is transmitted. For example, light may be emitted from the first area 100 and external light may pass through the second area 200.

A plurality of insulating layers, for example, first through fourth insulating layers 13, 15, 17, and 19, a light-emitting device EL that is disposed on the first through fourth insulating layers 13, 15, 17, and 19, and a pixel circuit unit that is disposed under the light-emitting device EL, are disposed in the first area 100. The second area 200 is disposed beside the first area 100. An inorganic insulating film 113 that is disposed on a buffer layer 11 and the fourth insulating layer 19 that covers the inorganic insulating film 113 are disposed in the second area 200. The first, second, and third insulating layers 13, 15, and 17 are not disposed on the inorganic insulating film 113.

The buffer layer 11 may be disposed on the substrate 10. The light-emitting device EL, and the pixel circuit unit including at least one TFT and at least one capacitor CAP, are disposed on the buffer layer 11 in the first area 100. The pixel circuit unit is disposed so that at least a part of the pixel circuit unit overlaps the light-emitting device EL.

The TFT includes an active layer 211, a gate electrode 214 that is disposed to be insulated from the active layer 211, and a source electrode 219a and a drain electrode 219b that are electrically connected to the active layer 211. The source electrode 219a includes a first source electrode 217a and a second source electrode 218a. The drain electrode 219b includes a first drain electrode 217b and a second drain electrode 218b.

The first insulating layer 13 may be disposed between the active layer 211 and the gate electrode 214. The second insulating layer 15 and the third insulating layer 17 may be disposed between the gate electrode 214 and the source and drain electrodes 219a and 219b.

The capacitor CAP includes a first capacitor electrode 314 that is disposed on the same layer as the gate electrode 214, a second capacitor electrode 316 that is disposed between the second insulating layer 15 and the third insulating layer 17, and a third capacitor electrode 319 that is disposed on the same layer as the source electrode 219a and the drain electrode 219b. The third capacitor electrode 319 includes a third capacitor lower electrode 317 and a third capacitor upper electrode 318.

The second insulating layer 15 may be disposed between the first capacitor electrode 314 and the second capacitor electrode 316. The third insulating layer 17 may be disposed between the second capacitor electrode 316 and the third capacitor electrode 319.

The light-emitting device EL includes the first electrode 121, the second electrode 125 that faces the first electrode 121, and an intermediate layer 123 that is disposed between the first electrode 121 and the second electrode 125. The intermediate layer 123 includes an organic emission layer. The first electrode 121 is disposed on the fourth insulating layer 19 that covers the pixel circuit unit, and is electrically connected to the source electrode 219a or the drain electrode 219b. According to an exemplary embodiment of the present invention, the first electrode 121 is connected to the source electrode 219a, as shown in FIG. 4. An edge of the first electrode 121 is covered by a pixel-defining film 21.

Figure 5:
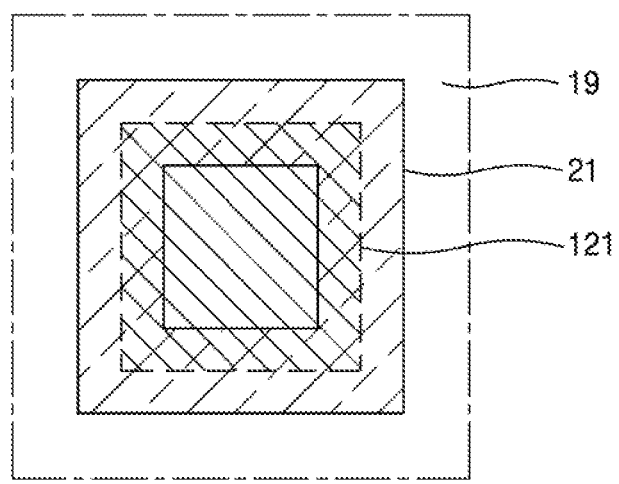
FIG. 5 is a plan view illustrating a positional relationship between a first electrode and a pixel-defining film of the display apparatus of FIG. 4, according to an exemplary embodiment of the present invention.

FIG. 5 is a plan view illustrating a positional relationship between the first electrode 121 and the pixel-defining film 21 of the display apparatus of FIG. 4, according to an exemplary embodiment of the present invention. The pixel-defining film 21 may be formed on a part of the fourth insulating layer 19 to cover an edge of the first electrode 121 in a closed-loop shape, instead of being formed on the whole fourth insulating layer 19. For example, the pixel-defining film 21 is formed exclusively in a part of the first area 100, and is not formed in the second area 200. Although the pixel-defining film 21 has a square or rectangular donut-like closed-loop shape (e.g., a rectangular ring shape) in FIG. 5, the present invention is not limited thereto. Although widths of the pixel-defining film 21 are the same along the edge of the first electrode 121 in FIG. 5, the present invention is not limited thereto. For example, a width of the pixel-defining film 21 that is disposed along one edge of the first electrode 121 may be greater or less than a width of the pixel-defining film 21 that is disposed along another edge of the first electrode 121.

The first electrode 121 may be a reflective electrode, and may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a combination thereof and a transparent or semi-transparent electrode layer that is formed on the reflective layer. The first electrode 121 may be formed in each sub-pixel to have an isolated island shape.

The second electrode 125 may be a transparent or semi-transparent electrode, may include at least one material selected from Ag, Al, Mg, Li, Ca, Cu, LiF/Ca, LiF/Al, MgAg, and CaAg, and may be formed as a thin film having a thickness that ranges from several nm (e.g., less than ten nm) to tens of nm. The second electrode 125 may be provided to be electrically connected to all pixels included in the display apparatus 1.

The intermediate layer 123 may be disposed between the first electrode 121 and the second electrode 125. The intermediate layer 123 may include the organic emission layer that emits light, and may further include at least one of a hole injection layer (HIL), a hole transport layer (HTL), an electron transport layer (ETL), and an electron injection layer (EIL). However, the present invention is not limited thereto, and various functional layers may be disposed between the first electrode 121 and the second electrode 125.

The organic emission layer may emit red light, green light, or blue light. However, the present invention is not limited thereto, and the organic emission layer may emit white light. In this case, the organic emission layer may include a structure in which a light-emitting material that emits red light, a light-emitting material that emits green light, and a light-emitting material that emits blue light are stacked, or a structure in which a light-emitting material that emits red light, a light-emitting material that emits green light, and a light-emitting material that emits blue light are combined with one another.

The use of red, green, and blue light are merely exemplary, and the present invention is not limited thereto. For example, as long as white light may be emitted, any other combinations than the combination of red, green, and blue light may be made.

The display apparatus 1, according to an exemplary embodiment of the present invention, may be a top-emission type display apparatus in which an image is displayed at a side of the second electrode 125. The first, second, and third pixel circuit units PC1, PC2, and PC3 (see FIG. 3) each including the TFT, etc. may be disposed between the substrate 10 and the first electrodes 121 corresponding to each of the first, second, and third sub-pixel SP1, SP2, and SP3.

The inorganic insulating film 113 is disposed on the buffer layer 11 in the second area 200. The inorganic insulating film 113 is disposed on the buffer layer 11. The inorganic insulating film 113 is covered by the fourth insulating layer 19. For example, the inorganic insulating film 113 that is disposed on the buffer layer 11 and the fourth insulating layer 19 that covers the inorganic insulating film 113 are included in the second area 200. The intermediate layer 123 and the second electrode 125 that extend from the first area 100 may be disposed on the fourth insulating layer 19. The organic emission layer is not included in the intermediate layer 123 that is disposed in the second area 200. The second electrode 125 may include a light-transmitting window TW that is formed in a portion corresponding to the second area 200. According to an exemplary embodiment of the present invention, the light-transmitting window TW may be disposed on a recess formed on the fourth insulating layer 19 disposed in the second area 200 or alternatively, on a recess formed on the pixel-defining film 21 that is disposed in the second area 200. Light may pass through the light-transmitting window TW of the second electrode 125 and through the fourth insulating layer 19 disposed in the second area 200 or through the pixel-defining film 21 that is disposed in the second area 200.

The inorganic insulating film 113 may be a single film or a double-layered film (e.g., two-layered film) including $SiO_2$ and/or $SiN_x$, and may include the same material as that of the first insulating layer 13. In the display apparatus 1, according to an exemplary embodiment of the present invention, when the inorganic insulating film 113, that is disposed in the second area 200 through which external light is transmitted, is a single film, interfacial reflection that may occur at a boundary surface between films having different refractive indices may be minimized. Accordingly, a transmittance of the display apparatus 1 may be increased.

Although the intermediate layer 123 and the second electrode 125 are disposed in the second area 200 in FIG. 4, the intermediate layer 123 and the second electrode 125 need not be disposed in the second area 200. In this case, a transmittance of the second area 200 may be further increased.

A pad electrode 419 that is a connection terminal of an external driver is disposed in the pad unit PA. The pad electrode 419 is formed on the third insulating layer 17, and includes a first pad electrode 417 and a second pad electrode 418.

An edge of the second pad electrode 418 is covered by the fourth insulating layer 19. The second pad electrode 418 may prevent the first pad electrode 417 from being exposed to moisture and oxygen, thereby preventing reduction in the reliability of the pad electrode 419.

A capping layer may be additionally disposed over the second electrode 125. The capping layer may have a single-layer structure including one material selected from an organic material, an inorganic material, and a combination thereof, or a multi-layer structure including materials having different refractive indices.

FIGS. 6 through 13 are cross-sectional views for explaining a method of manufacturing the display apparatus 1 of FIG. 4, according to an exemplary embodiment of the present invention.

Figure 6:
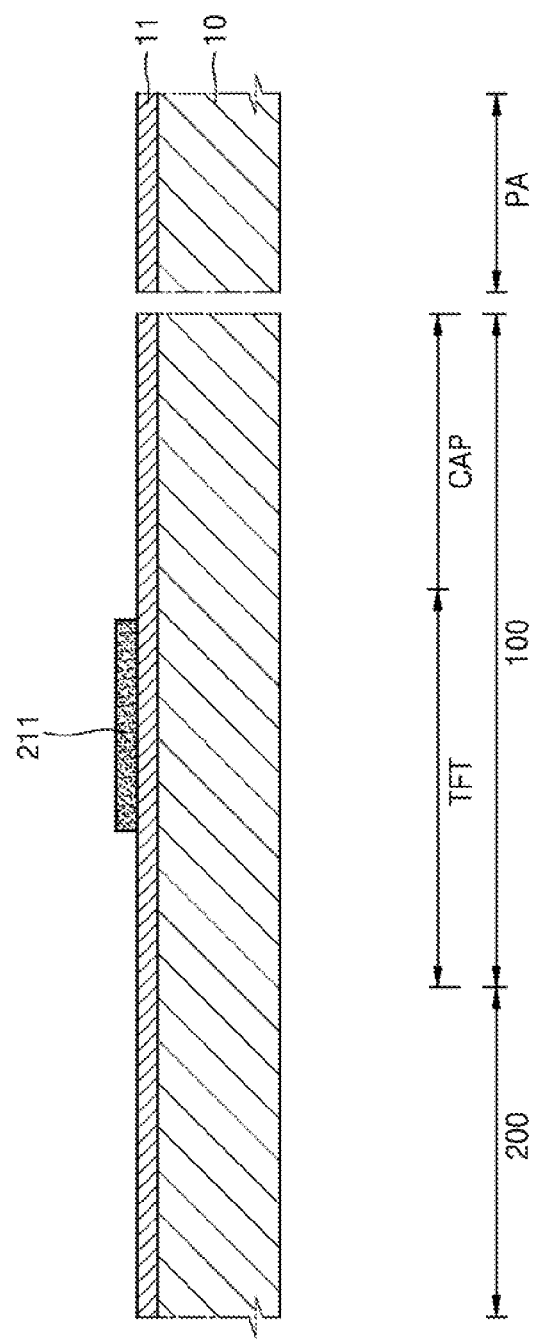
FIGS. 6 through 13 are cross-sectional views for explaining a method of manufacturing the display apparatus of FIG. 4, according to an exemplary embodiment of the present invention.

FIG. 6 is a cross-sectional view for explaining a first mask process, according to an exemplary embodiment of the present invention. The buffer layer 11 is disposed on the substrate 10, a semiconductor layer is formed on the buffer layer 11, and the semiconductor layer is patterned to form the active layer 211 of the TFT.

The substrate 10 may include glass, or plastic, or the like. The buffer layer 11 may prevent penetration of impurities into the substrate 10 and planarize a surface of the substrate 10. The buffer layer 11 may have a single-layer structure or a multi-layer structure including an inorganic material such as silicon nitride ($SiN_x$) and/or silicon oxide ($SiO_x$).

The semiconductor layer may include any of various materials. For example, the semiconductor layer may include an inorganic semiconductor material such as amorphous silicon or crystalline silicon. Alternatively, the semiconductor layer may include an oxide semiconductor or an organic semiconductor material.

Figure 7:
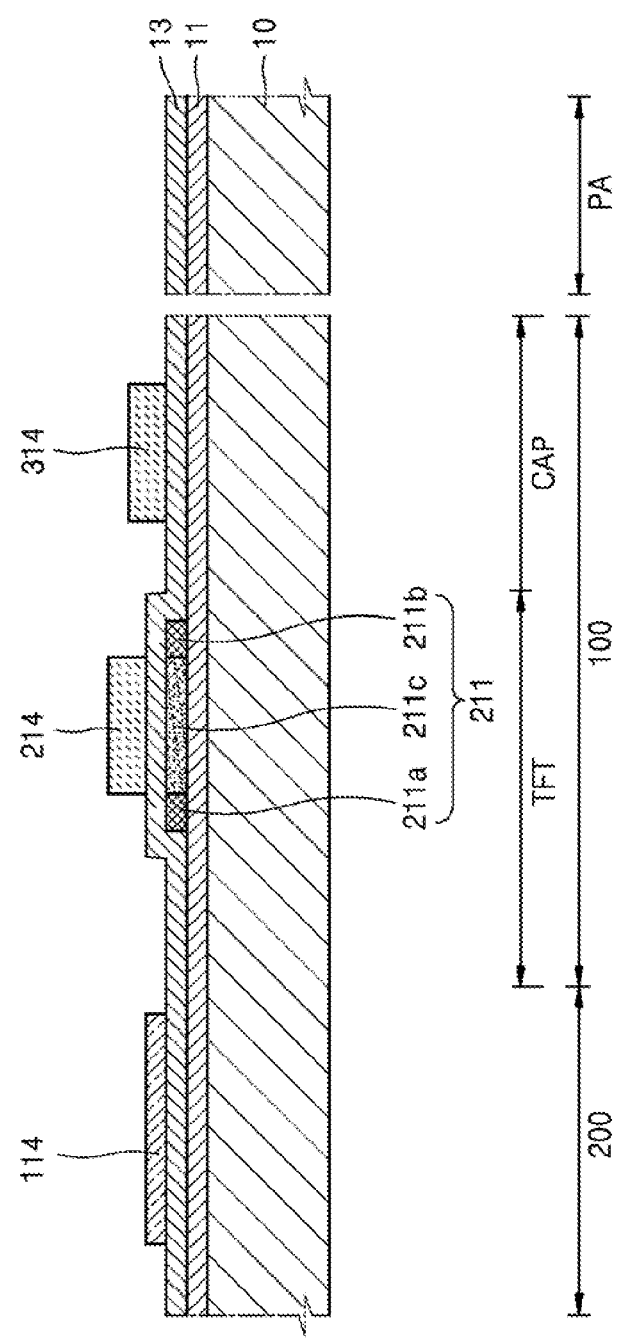

FIG. 7 is a cross-sectional view for explaining a second mask process, according to an exemplary embodiment of the present invention. The first insulating layer 13 is formed on a resultant structure of the first mask process of FIG. 6. A first conductive layer is formed on the first insulating layer 13, and patterning is performed on the first conductive layer. Accordingly, the gate electrode 214 of the TFT and the first capacitor electrode 314 of the capacitor CAP are formed in the first area 100, and a metal pattern 114 is formed in the second area 200.

The first insulating layer 13 may be an inorganic insulating film. The first insulating layer 13 may have a single-layer structure or a multi-layer structure including at least one insulating film selected from $SiO_2$, $SiN_x$, SiON, $Al_2O_3$, $TiO_2$, $Ta_2O_5$, $HfO_2$, $ZrO_2$, barium strontium titanate (BST), and lead zirconate titanate (PZT).

B or P-ion impurities are doped on a structure of the second mask process of FIG. 7. Accordingly, the active layer 211 includes a source region 211a and a drain region 211b that are doped with ion impurities and a channel region 211c that is formed between the source region 211a and the drain region 211b.

The first conductive layer may have a single-layer structure or a multi-layer structure including at least one material selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). For example, the first conductive layer may have a three-layer structure including Mo/Al/Mo or Ti/Al/Ti.

Figure 8:
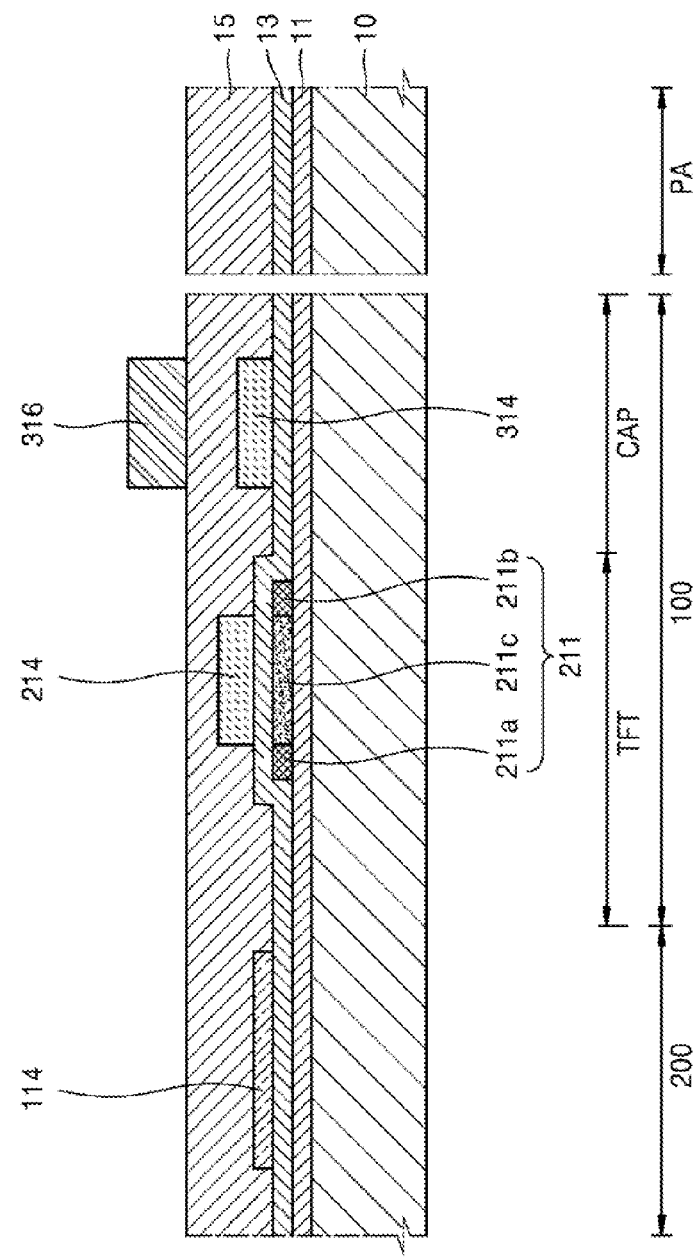

FIG. 8 is a cross-sectional view for explaining a third mask process, according to an exemplary embodiment of the present invention. The second insulating layer 15 is formed on a resultant structure of the second mask process of FIG. 7. A second conductive layer is formed on the second insulating layer 15, and patterning is performed on the second conductive layer. Accordingly, the second capacitor electrode 316 of the capacitor CAP is formed.

The second insulating layer 15 may be an inorganic insulating film. The second insulating layer 15 may have a single-layer structure or a multi-layer structure including at least one insulating film selected from $SiO_2$, $SiN_x$, SiON, $Al_2O_3$, $TiO_2$, $Ta_2O_5$, $HfO_2$, $ZrO_2$, BST, and PZT.

The second conductive layer may have a single-layer structure or a multi-layer structure including at least one material selected from Al, Pt, Pd, Ag, Mg, Au, Ni, Nd, Ir, Cr, Li, Ca, Mo, Ti, W, and Cu. For example, the second conductive layer may have a three-layer structure including Mo/Al/Mo or Ti/Al/Ti.

Figure 9:
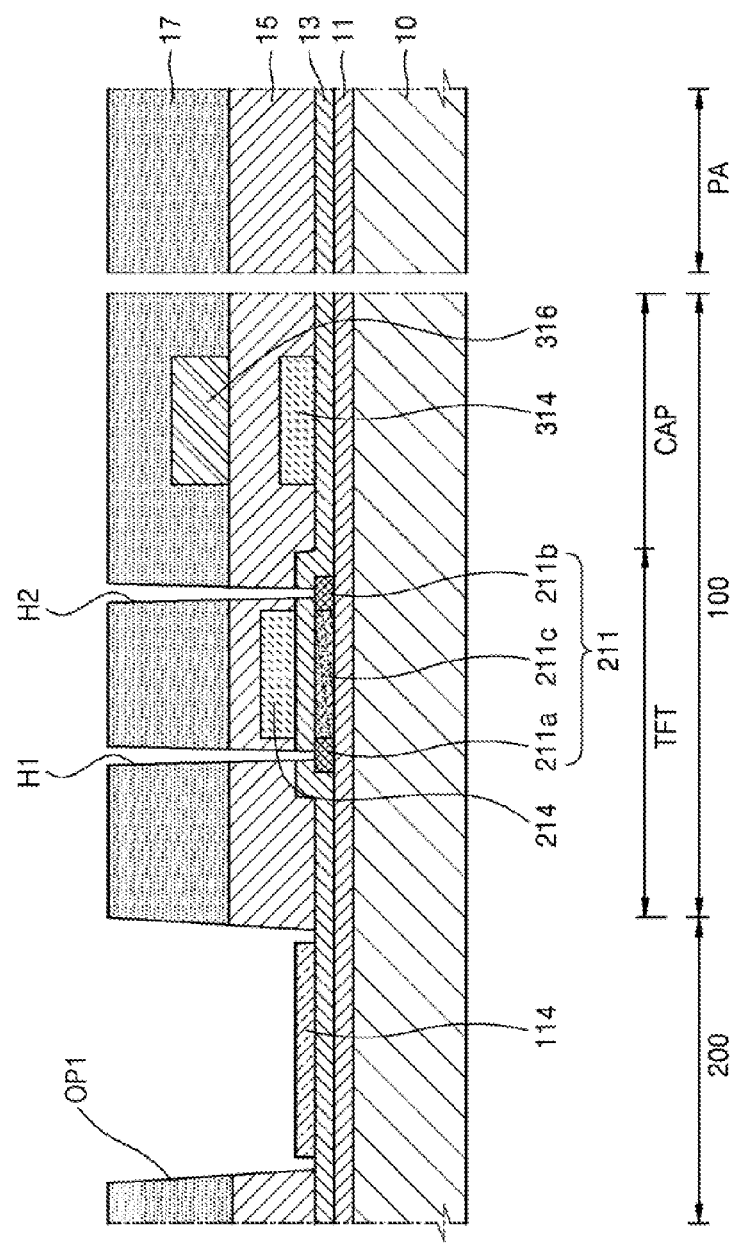

FIG. 9 is a cross-sectional view for explaining a fourth mask process, according to an exemplary embodiment of the present invention. The third insulating layer 17 is formed on a resultant structure of the third mask process of FIG. 8. The first insulating layer 13, the second insulating layer 15, and the third insulating layer 17 are patterned. Contact holes H1 and H2, through which parts of the source region 211a and the drain region 211b of the active layer 211 are exposed, are formed in the first insulating layer 13, the second insulating layer 15, and the third insulating layer 17. An opening OP1, through which the metal pattern 114 of the second area 200 that is spaced apart from the active layer 211 is exposed, are formed in the first insulating layer 13, the second insulating layer 15, and the third insulating layer 17.

The third insulating layer 17 may be an inorganic insulating film. The third insulating layer 17 may have a single-layer structure or a multi-layer structure including at least one insulating film selected from $SiO_2$, $SiN_x$, SiON, $Al_2O_3$, $TiO_2$, $Ta_2O_5$, $HfO_2$, $ZrO_2$, BST, and PZT.

Figure 10:
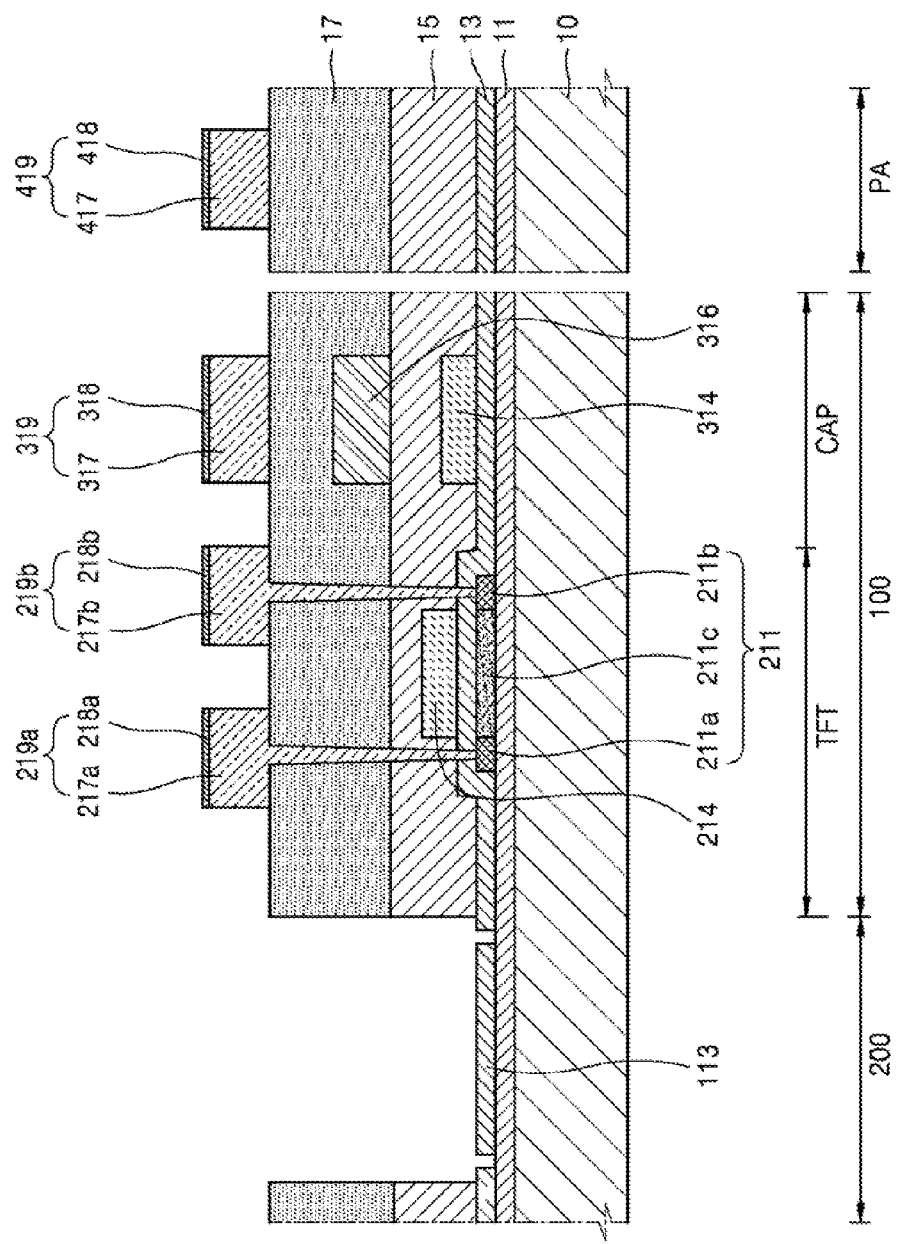

FIG. 10 is a cross-sectional view for explaining a fifth mask process, according to an exemplary embodiment of the present invention. A third conductive layer and a fourth conductive layer are sequentially formed on a resultant structure of the fourth mask process of FIG. 9. The third conductive layer and the fourth conductive layer are simultaneously patterned. Accordingly, the source electrode 219a and the drain electrode 219b of the TFT and the third capacitor electrode 319 of the capacitor CAP are formed in the first area 100. In the second area 200, the metal pattern 114 is removed, and the inorganic insulating film 113 is formed on a portion corresponding to the metal pattern 114. Although the first insulating layer 13 is patterned to form the inorganic insulating film 113, the present invention is not limited thereto. A part of the first insulating layer 13 that is disposed in the second area 200 may function as the inorganic insulating film 113 without patterning the first insulating layer 13. The pad electrode 419 is formed in the pad unit PA.

The third conductive layer may have a single-layer structure or a multi-layer structure including a metal layer selected from Al, Pt, Pd, Ag, Mg, Au, Ni, Nd, Ir, Cr, Li, Ca, Mo, Ti, W, Cu, and an alloy thereof.

The fourth conductive layer may be formed of a transparent conductive oxide including at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The source electrode 219a includes the first source electrode 217a that is formed of a part of the third conductive layer, and the second source electrode 218a that is formed of a part of the fourth conductive layer. The drain electrode 219b includes the first drain electrode 217b that is formed of a part of the third conductive layer and the second drain electrode 218b that is formed of a part of the fourth conductive layer. The third capacitor electrode 319 includes the third capacitor lower electrode 317 that is formed of a part of the third conductive layer and the third capacitor upper electrode 318 that is formed of a part of the fourth conductive layer. The pad electrode 419 includes the first pad electrode 417 that is formed of a part of the third conductive layer and the second pad electrode 418 that is formed of a part of the fourth conductive layer.

The second source electrode 218a, the second drain electrode 218b, the third capacitor upper electrode 318, and the second pad electrode 418 may respectively function as protective layers of the first source electrode 217a, the first drain electrode 217b, the third capacitor lower electrode 317, and the first pad electrode 417.

Since the third conductive layer and the fourth conductive layer are patterned by using the same mask process, the first source electrode 217a, the first drain electrode 217b, the third capacitor lower electrode 317, and the first pad electrode 417 may respectively have the same etched surfaces as those of the second source electrode 218a, the second drain electrode 218b, the third capacitor upper electrode 318, and the second pad electrode 418. However, the present exemplary invention is not limited thereto. The third conductive layer and the fourth conductive layer may be patterned by using different processes.

Figure 11:
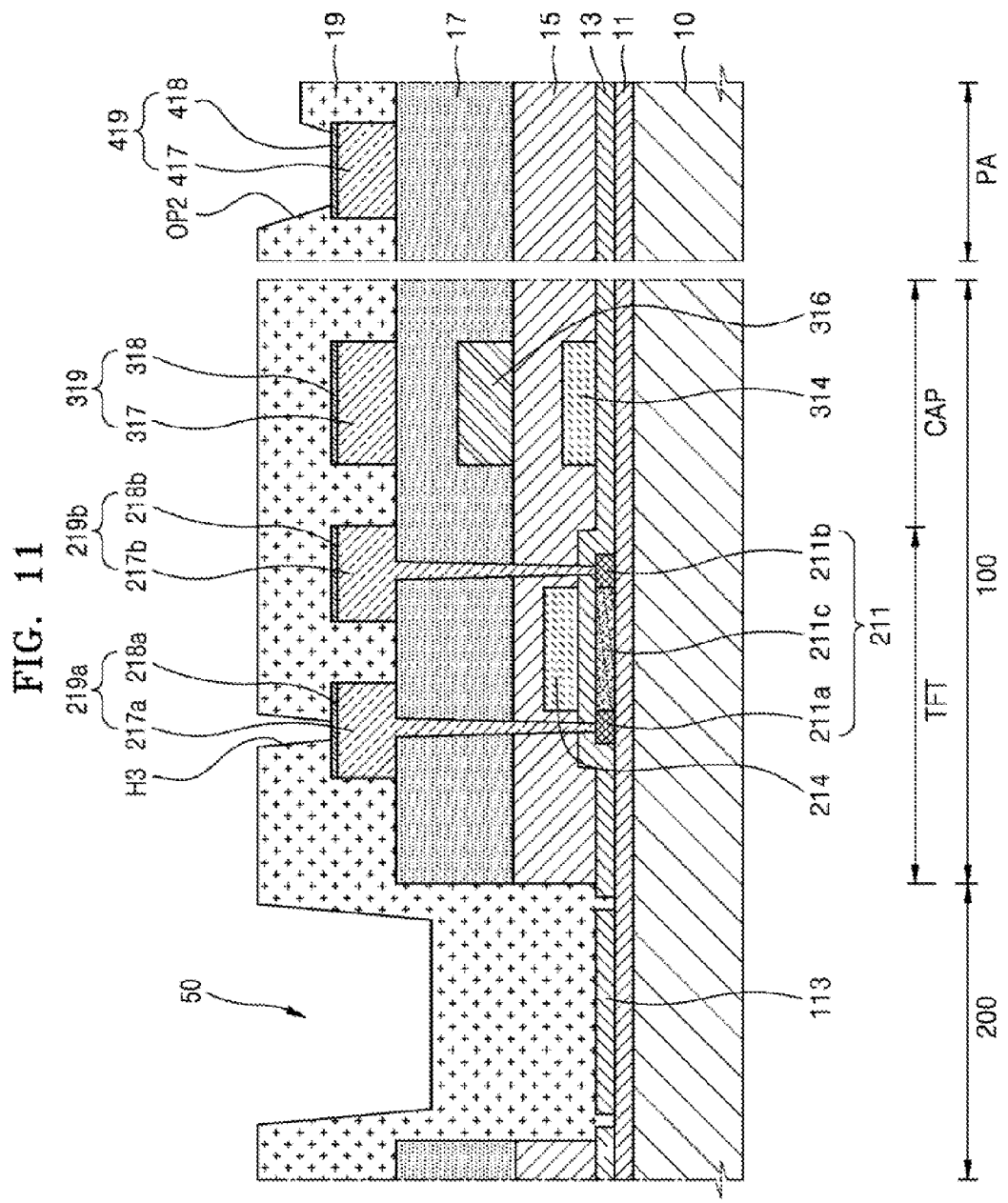

FIG. 11 is a cross-sectional view for explaining a sixth mask process, according to an exemplary embodiment of the present invention. The fourth insulating layer 19 is formed on a resultant structure of the fifth mask process of FIG. 10, and the fourth insulating layer 19 is patterned. Accordingly, a via-hole H3, through which a part of the source electrode 219a of the TFT of the first area 100 is exposed, and an opening OP2, through which a part of the pad electrode 419 of the pad unit PA is exposed, are formed in the fourth insulating layer 19. The fourth insulating layer 19 is disposed in both the first area 100 and the second area 200. The fourth insulating layer 19 covers the pixel circuit unit including the TFT and the capacitor CAP of the first area 100, and the fourth insulating layer 19 covers the insulating film 113 of the second area 200. Since a half-tone mask is used in the sixth mask process of FIG. 11, a trench 50 is formed in the fourth insulating layer 19 in the second area 200. Accordingly, a height of the fourth insulating layer 19 in the first area 100 is different from that of the fourth insulating layer 19 in the second area 200. A distance between the substrate 10 and a top surface of the fourth insulating layer 19 that is disposed in the second area 200 is less than a distance between the substrate 10 and a top surface of the fourth insulating layer 19 that is disposed in the first area 100. A thickness of the fourth insulating layer 19 that is disposed in the second area 200 may be equal to or less than 1 µm.

The fourth insulating layer 19 may have a single-layer structure or a multi-layer structure including an organic insulating film. The fourth insulating layer 19 may include a general-purpose polymer (e.g., poly(methyl methacrylate) (PMMA) or polystyrene (PS)), a polymer derivative including a phenol group, an acrylic polymer, an imide-based polymer, an arylether-based polymer, an amide-based polymer, a fluorine-based polymer, a p-xylene-based polymer, a vinylalcohol-based polymer, and/or a blend thereof. For example, the fourth insulating layer 19 may include polyimide, polyamide, and/or acrylic resin.

Figure 12:
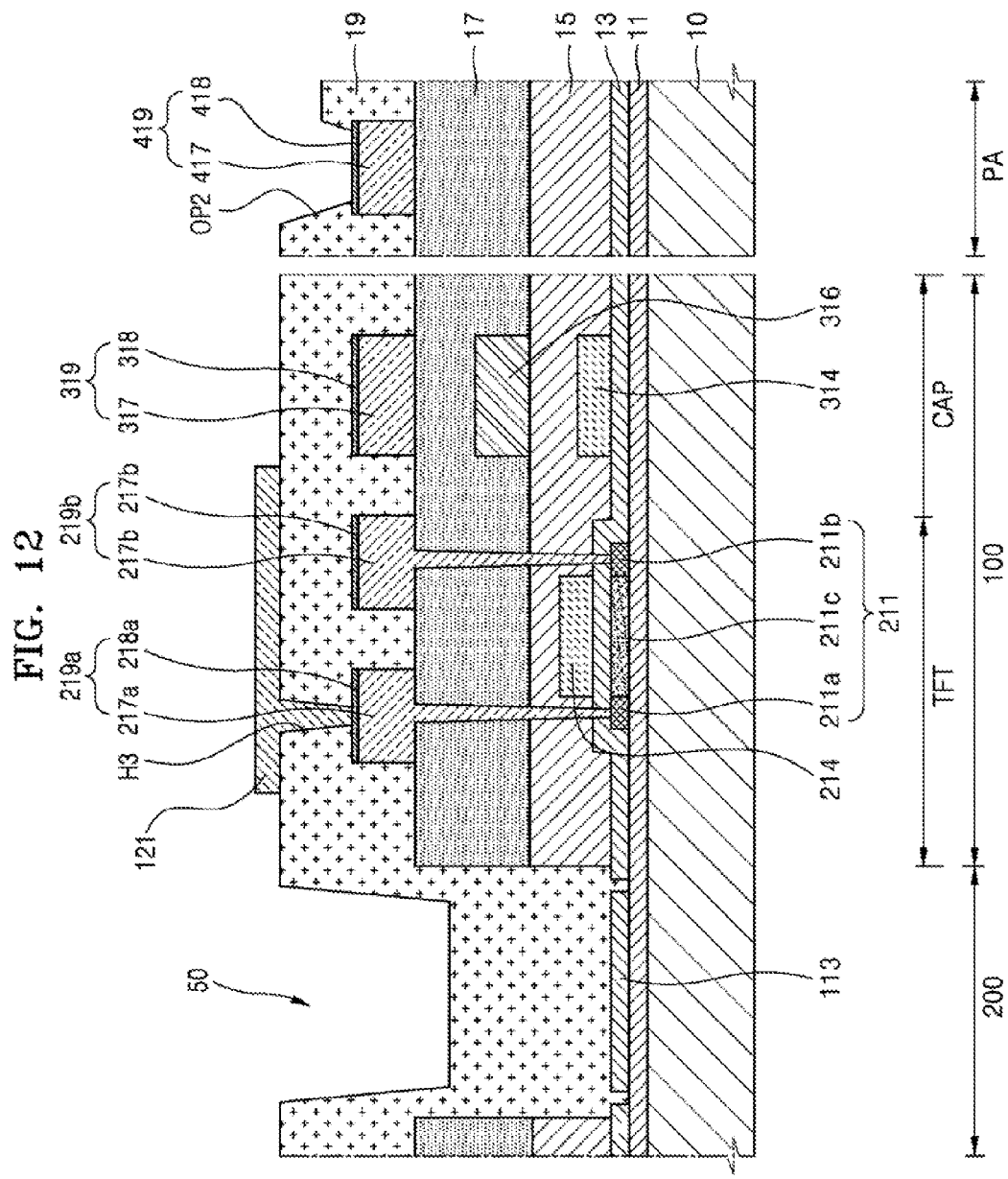

FIG. 12 is a cross-sectional view for explaining a seventh mask process, according to an exemplary embodiment of the present invention. A fifth conductive layer is formed on a resultant structure of the sixth mask process of FIG. 11. The first electrode 121 of the light-emitting device EL is formed in the first area 100 by patterning the fifth conductive layer. The first electrode 121 is electrically connected to the source electrode 219a through the via-hole H3. At least a part of the first electrode 121 overlaps the TFT and the capacitor CAP.

The fifth conductive layer may include a reflective layer including Ag, Mg, Al, Pt, Pd, Au, Ni, Nd, Ir, Cr, or a compound thereof, and a transparent or semi-transparent electrode layer that is formed on the reflective layer.

Figure 13:
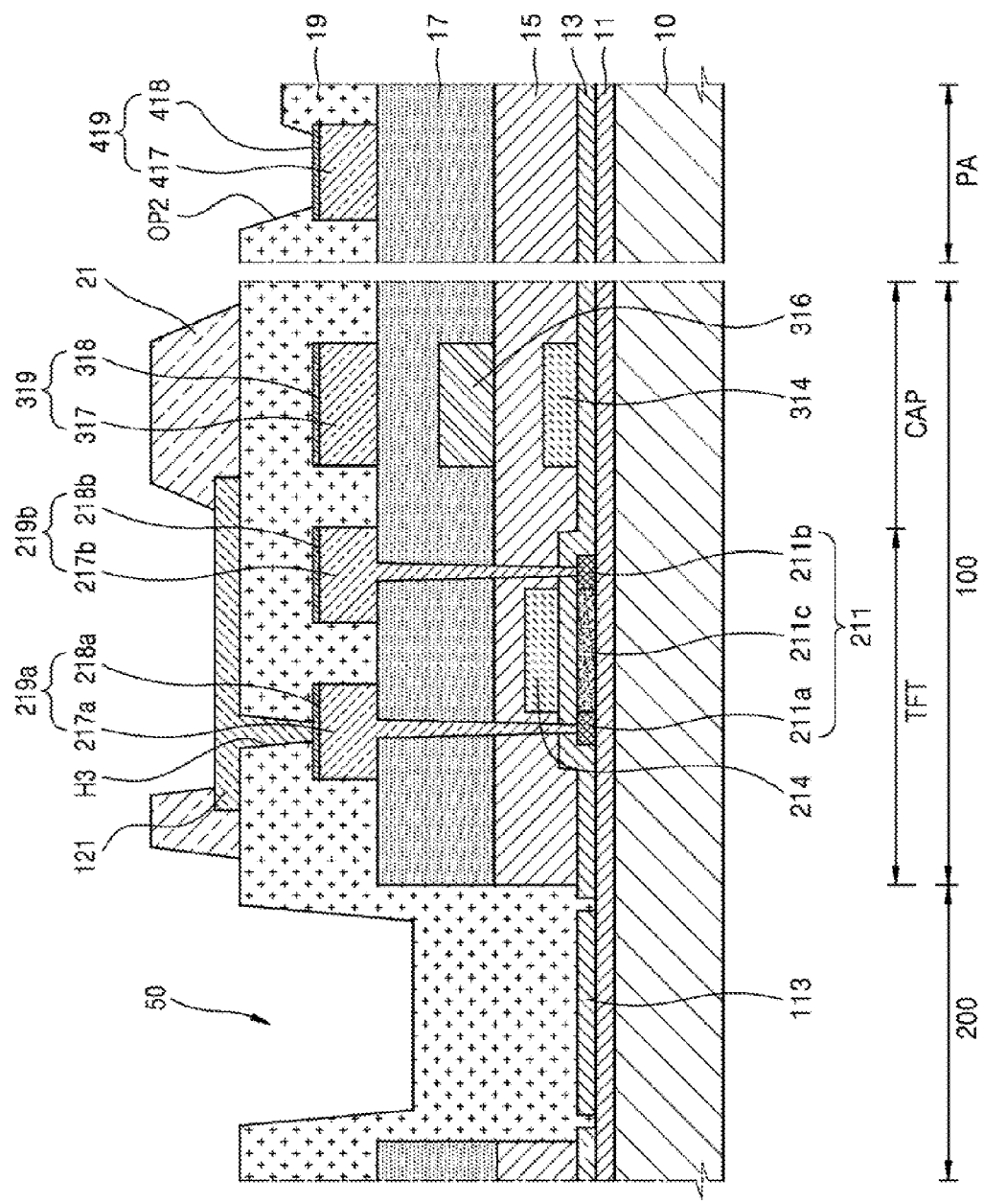

FIG. 13 is a cross-sectional view for explaining an eighth mask process, according to an exemplary embodiment of the present invention. A fifth insulating layer is formed on a resultant structure of the seventh mask process of FIG. 12. The pixel-defining film 21 is formed in the first area 100 by patterning the fifth insulating layer. The fifth insulating layer is patterned into an island shape to cover an edge of the first electrode 121 in each pixel PX. Accordingly, the pixel-defining film 21 covers the edge of the first electrode 121 in the first area 100 of each pixel PX, and is formed on the fourth insulating layer 19 to have a closed-loop shape. The pixel-defining film 21 is not disposed in the trench 50 of the fourth insulating layer 19 that is disposed in the second area 200.

The fifth insulating layer may have a single-layer structure or a multi-layer structure including an organic insulating film, like the fourth insulating layer 19.

The intermediate layer 123 (see FIG. 4) and the second electrode 125 (see FIG. 4) are formed on the substrate 10. The substrate 10 may be sealed by using a sealing member. A capping layer and a filler may be provided between the substrate 10 and the sealing member.

Figure 14:
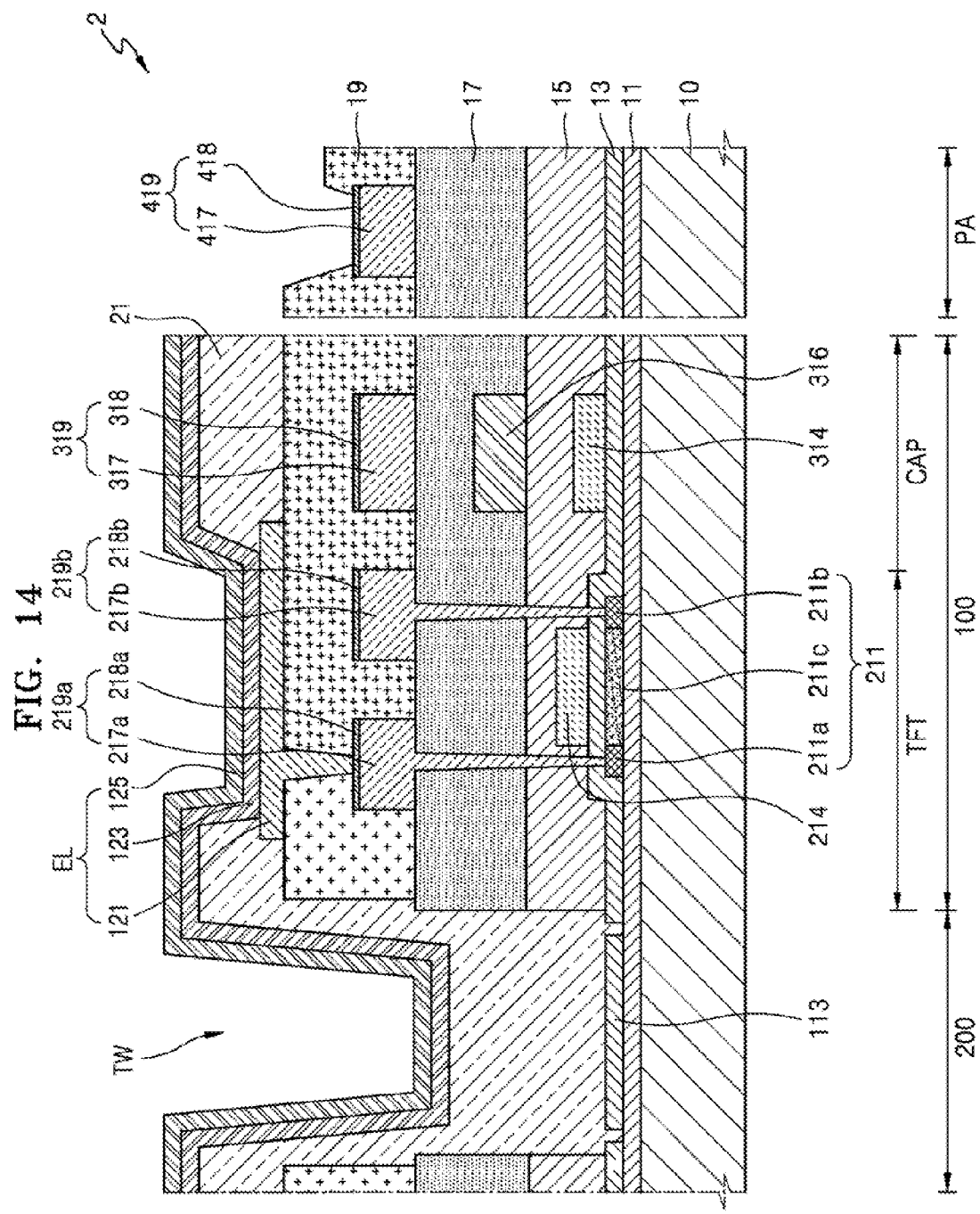
FIG. 14 is a cross-sectional view illustrating a part of one pixel and a part of the pad unit of a display apparatus according to an exemplary embodiment of the present invention.

FIG. 14 is a cross-sectional view illustrating a part of one pixel PX and a part of the pad unit PA of a display apparatus 2 according to an exemplary embodiment of the present invention.

Referring to FIG. 14, the pixel PX of the display apparatus 2, according to an exemplary embodiment of the present invention is disposed on the substrate 10. The pixel PX of the display apparatus 2 includes the first area 100, through which light is emitted, and the second area 200, through which external light is transmitted. For example, light is emitted from the first area 100 and external light passes through the second area 200.

The fourth insulating layer 19 covers the pixel circuit unit including the TFT and the capacitor CAP in the first area 100. According to an exemplary embodiment of the present invention, the fourth insulating layer 19 is not disposed in the second area 200. The fourth insulating layer 19 covers an edge of the second pad electrode 418 of the pad unit PA.

According to an exemplary embodiment of the present invention, the pixel-defining film 21 is disposed in both the first area 100 and the second area 200. In the first area 100, the pixel-defining film 21 covers an edge of the first electrode 121 and has therein an opening OP4, (see FIG. 17), through which a central portion of the first electrode 121 is exposed. In the second area 200, the pixel-defining film 21 completely covers a top surface of the inorganic insulating film 113. A thickness of the pixel-defining film 21 disposed in the second area 200 may be equal to or less than 1 µm.

Other elements of the display apparatus 2 may be similar to those of the display apparatus 1 of FIG. 4. Accordingly, a repeated explanation thereof may be omitted for brevity.

Figure 15:
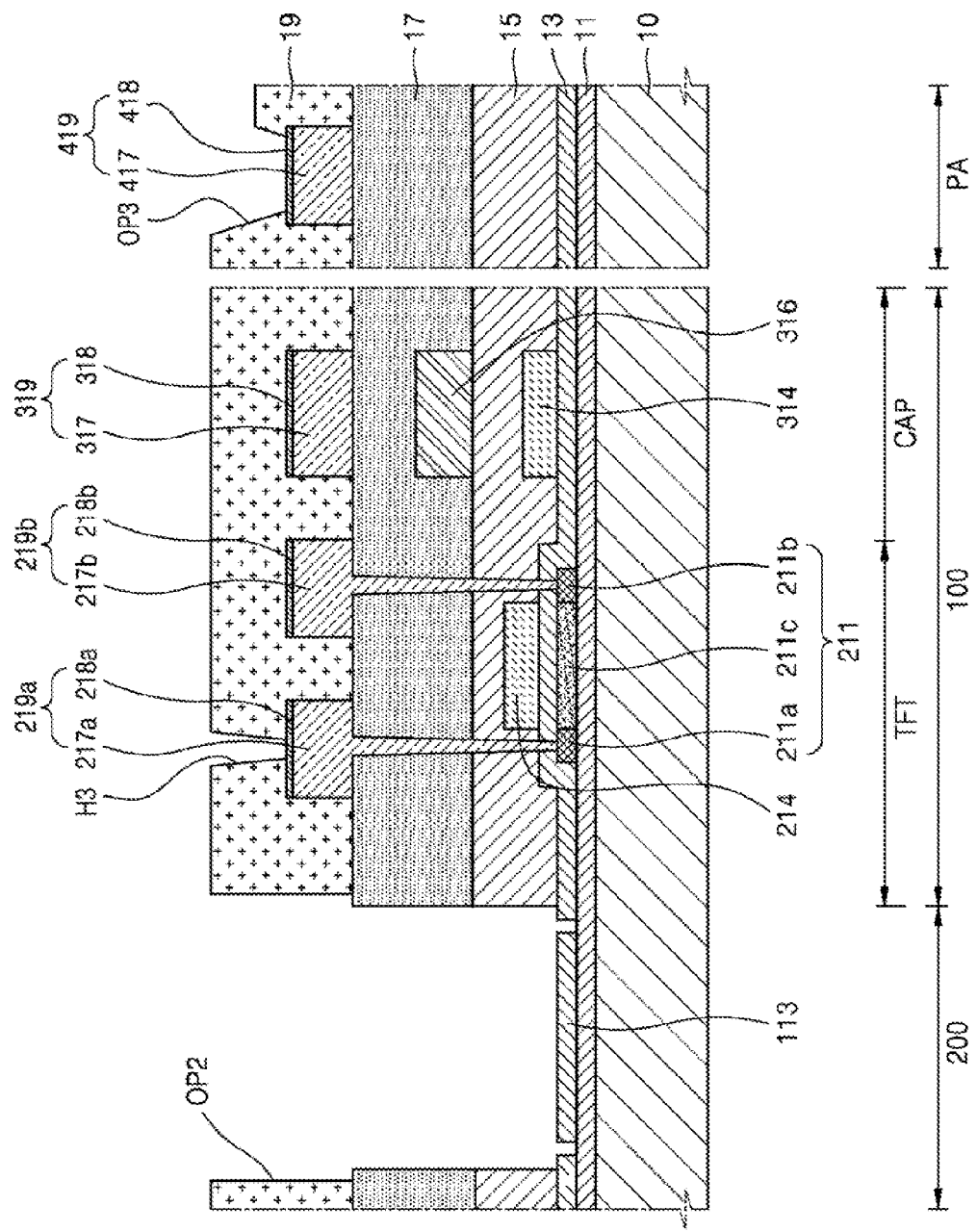
FIGS. 15 through 17 are cross-sectional views for explaining a method of manufacturing the display apparatus of FIG. 14, according to an exemplary embodiment of the present invention.
Figure 16:
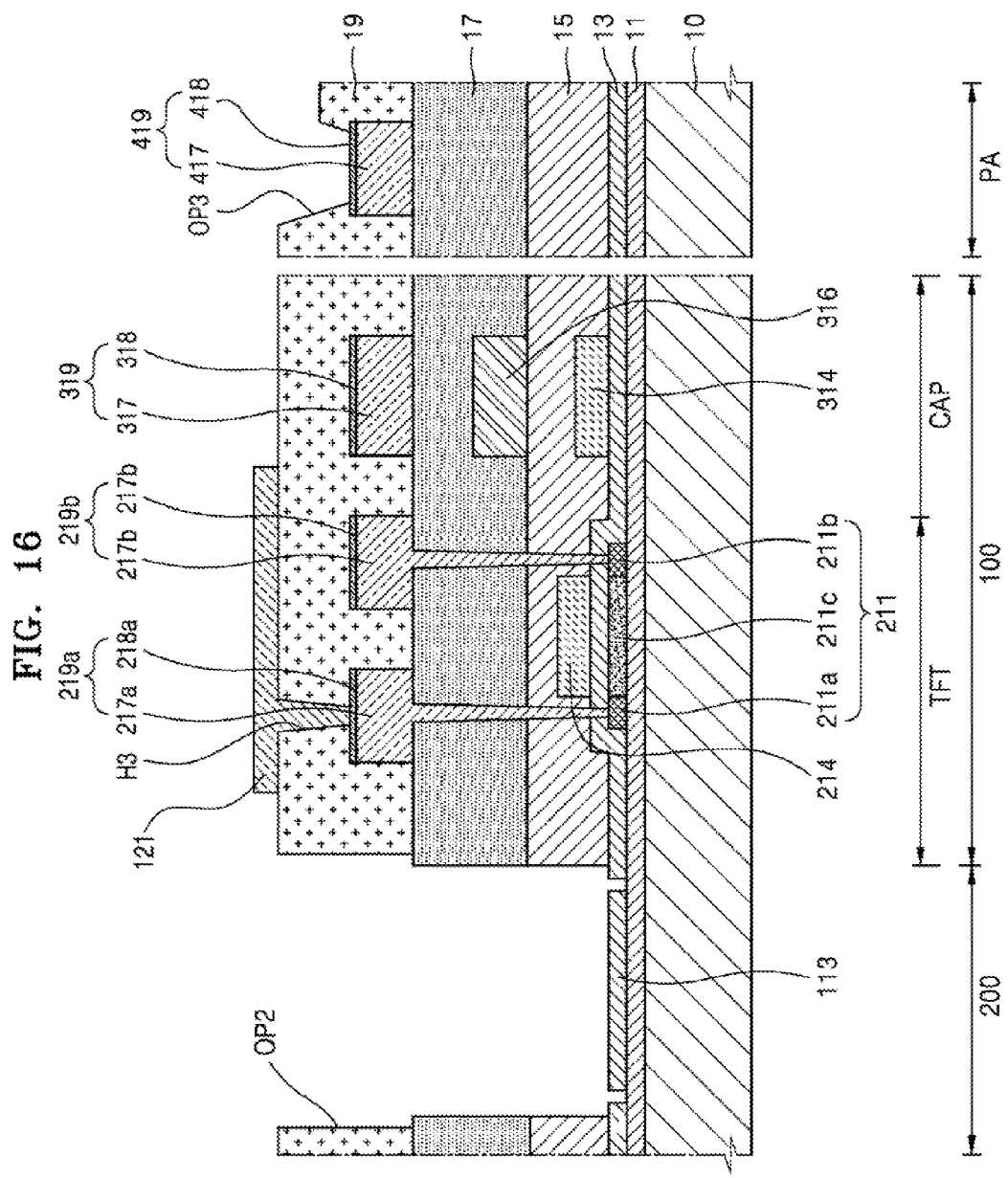
Figure 17:
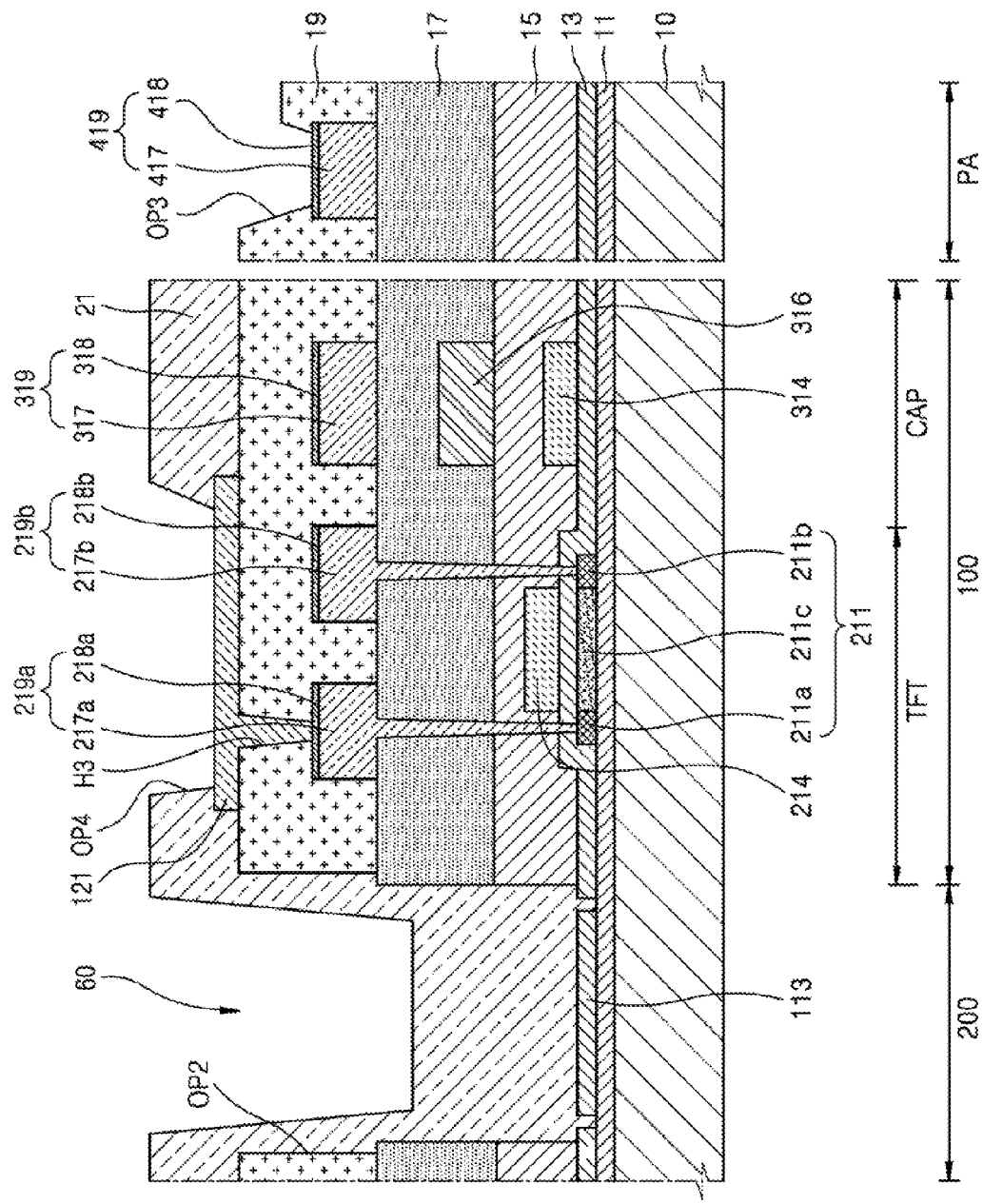

FIGS. 15 through 17 are cross-sectional views for explaining a method of manufacturing the display apparatus 2 of FIG. 14, according to an exemplary embodiment of the present invention. The following will be explained with reference to FIGS. 6 through 10.

FIG. 15 is a cross-sectional view for explaining a sixth mask process, according to an exemplary embodiment of the present invention. The fourth insulating layer 19 is formed on a resultant structure of the first through fifth mask processes of FIGS. 6 through 10, and the fourth insulating layer 19 is patterned. Accordingly, the via-hole H3, through which a part of the source electrode 219a of the TFT of the first area 100 is exposed, the opening OP2, through which the inorganic insulating film 113 of the second area 200 is exposed, and an opening OP3, through which the pad electrode 419 of the pad unit PA is exposed, are formed in the fourth insulating layer 19.

The fourth insulating layer 19 may have a single-layer structure or a multi-layer structure including an organic insulating film.

FIG. 16 is a cross-sectional view for explaining a seventh mask process, according to an exemplary embodiment of the present invention. A sixth conductive layer is formed on a resultant structure of the sixth mask process of FIG. 15. The first electrode 121 of the light-emitting device EL is formed in the first area 100 by patterning the sixth conductive layer. The first electrode 121 is electrically connected to the source electrode 219a through the via-hole H3. At least a part of the first electrode 121 overlaps the TFT and the capacitor CAP.

The sixth conductive layer may include a reflective layer including Ag, Mg, Al, Pt, Pd, Au, Ni, Nd, Ir, Cr, or a compound thereof, and a transparent or semi-transparent electrode layer that is formed on the reflective layer.

FIG. 17 is a cross-sectional view for explaining an eighth mask process, according to an exemplary embodiment of the present invention. A fifth insulating layer is formed on a resultant structure of the seventh mask process of FIG. 16. The pixel-defining film 21 is formed in the first area 100 and the second area 200 by patterning the fifth insulating layer. The pixel-defining film 21 covers an edge of the first electrode 121 in the first area 100, and has therein an opening OP4 through which a central portion of the first electrode 121 is exposed. Since a half-tone mask is used in the eighth mask process of FIG. 17, a trench 60 is formed in the pixel-defining film 21 in the second area 200. Accordingly, a height of the pixel-defining film 21 in the first area 100 is different from that of the pixel-defining film 21 in the second area 200. A distance between the substrate 10 and a top surface of the pixel-defining film 21 that is disposed in the second area 200 is less than a distance between the substrate 10 and a top surface of the pixel-defining film 21 that is disposed in the first area 100. A thickness of the pixel-defining film 21 that is disposed in the second area 200 may be equal to or less than 1 μm.

The fifth insulating layer may have a single-layer structure or a multi-layer structure including an organic insulating film, like the fourth insulating layer 19.

The intermediate layer 123 (see FIG. 14) and the second electrode 125 (see FIG. 14) are formed on the substrate 10. The substrate 10 may be sealed by using a sealing member. A capping layer and a filler may be provided between the substrate 10 and the sealing member.

According to the one or more exemplary embodiments of the present invention, since each pixel PX includes the first area 100 in which the light-emitting device EL that emits light is disposed, and the second area 200, which is disposed beside the first area 100 and which transmits external light therethrough, a see-through display apparatus or a transparent display apparatus may be obtained.

In a display apparatus according to an exemplary embodiment of the present invention, an organic insulating film remains to a predetermined thickness (e.g., has a predetermined thickness) while completely covering an inorganic insulating film that is disposed in the second area 200 of each pixel PX. Accordingly, detachment between the inorganic insulating film and the organic insulating film of the second area 200, which occurs due to a reduction in an adhesive force between the inorganic insulating film and the organic insulating film, may be avoided. In addition, a sufficient transmittance of the display apparatus may be ensured. The organic insulating film may be an insulating layer that planarizes the first area 100 or an insulating layer that is used to form a pixel-defining film. In addition, a step coverage in the second area 200 is increased, and a crack in a second electrode in the second area 200 may be prevented.

Although a TFT is a top-gate type TFT in which a gate electrode is disposed over an active layer in the exemplary embodiments of the present invention, the present invention is not limited thereto. For example, the gate electrode may be disposed under the active layer.

According to one or more exemplary embodiments of the present invention, a transparent display apparatus having an increased transmittance may be provided. However, the scope of the present invention is not limited by such an aspect.

While one or more exemplary embodiments of the present invention have been described with reference to the accompanying figures, it will be understood by those of ordinary skill in the art that various changes in form and detail may be made therein without departing from the spirit and scope of the present invention.

What is claimed is:

1. A display apparatus comprising:
   a pixel comprising a first area and a second area, wherein light is emitted from the first area and ambient light is transmitted through the second area;
   a pixel circuit unit disposed in the first area of the pixel, the pixel circuit unit comprising at least one thin-film transistor (TFT);
   a first insulating layer covering the pixel circuit unit in the first area;
   a first electrode disposed on the first insulating layer in the first area, the first electrode being electrically connected to the pixel circuit unit;
   a second insulating layer covering an edge of the first electrode in the first area;
   a second electrode aligned with the first electrode and disposed in the first area and the second area;
   an intermediate layer disposed between the first electrode and the second electrode, in the first area, and disposed under the second electrode in the second area, the intermediate layer comprising an emission layer;
   an inorganic insulating film disposed in the second area of the pixel; and
   an organic insulating film covering the inorganic insulating film in the second area.

2. The display apparatus of claim 1, wherein the organic insulating film is a part of the first insulating layer that is disposed in the second area.

3. The display apparatus of claim 2, wherein a first distance between a substrate and a top surface of the organic insulating film covering the inorganic insulating film in the second area is smaller than a second distance between the substrate and a top surface of the first insulating layer that is disposed in the first area.

4. The display apparatus of claim 2, wherein the second insulating layer is a pixel-defining film that covers all edges of the first electrode in the first area, and wherein the second insulating layer has a closed-loop shape.

5. The display apparatus of claim 1, wherein the organic insulating film covering the inorganic insulating film in the second area is a part of the second insulating layer that is disposed in the second area.

6. The display apparatus of claim 5, wherein a third distance between a substrate and a top surface of the organic insulating film covering the inorganic insulating film in the second area is smaller than a fourth distance between the substrate and a top surface of the second insulating layer that is disposed in the first area.

7. The display apparatus of claim 1, wherein at least a part of the pixel circuit unit overlaps the first electrode.

8. The display apparatus of claim 1, wherein the inorganic insulating film comprises a single film or a double-layered film comprising $SiO_2$ or $SiN_x$.

9. The display apparatus of claim 1, wherein the TFT comprises:
an active layer;
a gate electrode disposed on the active layer, the gate electrode being insulated from the active layer;
a third insulating layer disposed between the active layer and the gate electrode;
a plurality of fourth insulating layers disposed on the gate electrode; and
a source electrode and a drain electrode disposed on the plurality of fourth insulating layers, the source electrode and the drain electrode being electrically connected to the active layer.

10. The display apparatus of claim 9, wherein the third insulating layer comprises a same material as a material included in the inorganic insulating film.

11. The display apparatus of claim 9, wherein the plurality of fourth insulating layers comprise single films or double-layered films comprising $SiO_2$ or $SiN_x$.

12. The display apparatus of claim 9, further comprising a capacitor comprising a first capacitor electrode that is disposed on a same layer as the gate electrode, a second capacitor electrode that is disposed between the plurality of fourth insulating layers, and a third capacitor electrode that is disposed on a same layer as the source and drain electrodes.

13. The display apparatus of claim 1, wherein the second area is formed beside the first area.

14. The display apparatus of claim 1, wherein the organic insulating film directly contacts the inorganic insulating film in the second area.

15. The display apparatus of claim 1, further comprising a buffer layer in the first area and the second area, wherein the buffer layer is under the inorganic insulating film.

16. The display apparatus of claim 1, wherein the inorganic insulating film is separated from an insulating layer on the same layer in the first area.

17. A display apparatus comprising:
a pixel comprising a first area and a second area, wherein light is emitted from the first area and ambient light is transmitted through the second area;
a pixel circuit unit disposed in the first area of the pixel, the pixel circuit unit comprising at least one thin-film transistor (TFT);
a first insulating layer covering the pixel circuit unit in the first area;
a first electrode disposed on the first insulating layer in the first area, the first electrode being electrically connected to the pixel circuit unit;
a second insulating layer covering an edge of the first electrode in at least the first area;
a second electrode aligned with the first electrode and disposed in at least the first area;
an intermediate layer disposed between the first electrode and the second electrode, the intermediate layer comprising an emission layer;
an inorganic insulating film disposed in the second area of the pixel; and
an organic insulating film covering the inorganic insulating film in the second area,
wherein the TFT comprises:
an active layer;
a gate electrode disposed on the active layer, the gate electrode being insulated from the active layer;
a third insulating layer disposed between the active layer and the gate electrode;
a plurality of fourth insulating layers disposed on the gate electrode; and
a source electrode and a drain electrode disposed on the plurality of fourth insulating layers, the source electrode and the drain electrode being electrically connected to the active layer, and
wherein the source electrode comprises a lower electrode and an upper electrode, wherein the upper electrode of the source electrode comprises a first conductive material and the lower electrode of the source electrode comprises a conductive material that is different from the first conductive material, and the drain electrode comprises a lower electrode and an upper electrode, wherein the upper electrode of the drain electrode comprises a second conductive material and the lower electrode of the drain electrode comprises a conductive material that is different from the second conductive material.

18. The display apparatus of claim 17, wherein each of the first and second conductive materials comprises a transparent conductive material.

* * * * *